United States Patent [19]
Takahashi et al.

[11] Patent Number: 5,837,332
[45] Date of Patent: Nov. 17, 1998

[54] METHOD AND APPARATUS FOR PREPARING CRYSTAL THIN FILMS BY USING A SURFACE ACOUSTIC WAVE

[75] Inventors: Migaku Takahashi, Sendai; Katsuya Yokoyama, Yokohama; Jun Yamada, Yokohama; Takashi Shiba, Yokohama, all of Japan

[73] Assignees: Nihon Victor Kabushiki-kaisha; Kabushiki-kaisha Hitachi Seisakusho, both of Japan

[21] Appl. No.: 690,030

[22] Filed: Jul. 31, 1996

Related U.S. Application Data

[63] Continuation of Ser. No. 378,062, Jan. 25, 1995, abandoned, which is a continuation of Ser. No. 773,588, filed as PCT/JP90/01507, Nov. 19, 1990, published as WO91/07520, May7 30, 1991, abandoned.

[30] Foreign Application Priority Data

Nov. 19, 1989 [JP] Japan ..................................... 1-300177

[51] Int. Cl.⁶ ................................. B06B 1/00; H03H 9/00
[52] U.S. Cl. .......................... 427/600; 427/62; 427/100; 427/248.1; 204/192.15; 204/298.02; 310/313 A; 310/313 R; 310/313 B; 310/313 D
[58] Field of Search ..................................... 427/600, 100, 427/62, 248.1; 310/313 A, 313 R, 313 B, 313 D; 204/298.02, 192.15; 360/126, 55; 117/13, 905

[56] References Cited

U.S. PATENT DOCUMENTS

| | | | |
|---|---|---|---|
| 3,654,574 | 4/1972 | Dias | 333/30 |
| 4,414,243 | 11/1983 | Cline | 427/100 |
| 4,427,515 | 1/1984 | Yuhara et al. | 427/100 |
| 4,480,237 | 10/1984 | Yamada | 310/313 R |
| 4,610,894 | 9/1986 | Setsune et al. | 310/313 R |
| 4,657,775 | 4/1987 | Shioiri et al. | 427/100 |
| 4,981,714 | 1/1991 | Ohno et al. | 427/576 |
| 5,064,520 | 11/1991 | Miyake et al. | 204/192.11 |
| 5,152,864 | 10/1992 | Ieki et al. | 427/100 |
| 5,175,711 | 12/1992 | Shiba et al. | 310/313 D |

FOREIGN PATENT DOCUMENTS

| | | |
|---|---|---|
| 0190051 | 8/1986 | European Pat. Off. ........... 204/298.02 |
| 58-119219 | 7/1983 | Japan . |
| 60-256214 | 12/1985 | Japan . |
| 63-285194 | 11/1988 | Japan . |
| 1-79090 | 3/1989 | Japan . |
| 1-261298 | 10/1989 | Japan . |
| 1-317112 | 12/1989 | Japan . |

OTHER PUBLICATIONS

Acoustic Surface Wave Induced Control of Grain Size in Thin Films by M.J. Brady and V. Sadagopan, IPM Technical Disclosure Bulletin, vol. 16, No. 11 Apr. 1974.

*Primary Examiner*—Roy V. King
*Attorney, Agent, or Firm*—Baker & Daniels

[57] ABSTRACT

A method and apparatus for preparing thin films, a device, an electronic and magnetic apparatus, an information recording and reproducing apparatus, an information processing apparatus and a crystal preparing method from the molten state. A thin film is prepared as the substrate or the surface of the substrate is being excited and characterized by a device having at least a substrate and a thin film with at least one layer prepared thereon and an electronic and magnetic apparatus having integration of the devices, wherein at least one layer of the thin film is prepared as the surface of the substrate is being excited. The recording and reproducing apparatus for recording and reproducing information is composed of an information memory medium device having a recording layer of the thin film prepared as the surface of the substrate is being excited and a recording head whose core is prepared as the surface of the substrate is being excited. An information processing apparatus for use in input, record, process and output of information is composed of an information memory medium device having a recording layer which is prepared as the surface of the substrate is being excited and a processing part having a semiconductor device with a thin film prepared as the surface of the substrate is being excited.

12 Claims, 15 Drawing Sheets

FIG_ 10

METHOD AND APPARATUS FOR PREPARING CRYSTAL THIN FILMS BY USING A SURFACE ACOUSTIC WAVE

This is a continuation of application Ser. No. 08/378,062, filed Jan. 25, 1995, now abandoned, which is a continuation of application Ser. No. 07/773,588, filed as PCT/JP90/01507 Nov. 19, 1990, published as WO91/07520 May 30, 1991, now abandoned.

BACKGROUND OF THE INVENTION

The present invention relates to a method and an apparatus for preparing thin films, a device, an electronic and magnetic apparatus, an information recording and reproducing apparatus, an information processing apparatus and a method for preparing crystal from the melt.

In recent years, various techniques have been proposed with reference to methods for forming thin films and for preparing crystal. Thin film forming methods such as evaporation, sputtering, CVD and the like are described in "Thin Film Handbook" ed. by the Japan Society for the Promotion of Science (Ohm), and as to single crystal forming method, for example, Czochralski method and zone melting method are well known, as described in "Crystal Technology Handbook" ed. by the Compilation Committee of kessho-kogaku handbook (Kyoritu Shuppan).

The prior art techniques mentioned above are effective for the control of crystal growth, but the effects of mechanical oscillation on the crystal growth surface have not been taken into consideration.

The purpose of the present invention is to provide a thin film forming method and a thin film forming apparatus which take advantage of the effect of mechanical oscillation on crystal growth at the initial stage of crystal growth.

Another purpose of the present invention is to provide a device having a thin film prepared by taking advantage of the effect of mechanical oscillation on crystal growth at the initial stage of crystal growth.

SUMMARY OF THE INVENTION

The first aim of the present invention is to provide a method for forming a thin film on the surface of a substrate, wherein the thin film is formed as the substrate or the surface of the substrate being excited.

The second aim of the present invention is to provide a thin film forming apparatus for forming a thin film on the surface of the substrate, wherein means for exciting the surface of the substrate by surface acoustic wave (SAW) is installed.

The third aim of the present invention is to provide a device comprising a substrate and a thin film with at least one layer prepared thereon, wherein at least one layer of the thin film is prepared as the surface of the substrate is being excited.

The fourth aim of the present invention is to provide an electronic and magnetic apparatus comprising a device having at least a substrate and a thin film with at least one layer prepared thereon, wherein at least one layer of the thin film is prepared as the surface of the substrate is being excited.

The fifth aim of the present invention is to provide an apparatus for recording and reproducing information comprising an information memory medium device with a thin film prepared as the surface of the substrate is being excited and a recording head whose core part has a thin film prepared as the surface of the substrate is being excited.

The sixth aim of the present invention is to provide an information processing apparatus for use in the input, recording process and output of information, comprising a recording part having an information memory medium device wherein a recording layer is a thin film prepared as the surface of the substrate is being excited and a processing part with a semiconductor device having a thin film prepared as the surface of the substrate is being excited.

The seventh aim of the present invention is to provide a crystal forming method for growing crystal by cooling down the melt from high temperature, wherein the crystal is prepared as being excited.

The present inventors have found out that the structure of crystal grain is changed by the mechanical oscillation put on the crystal growing surface at initial stage of crystal growth. According to this finding, it becomes possible to control crystal growth by oscillation as mentioned above, then to form various thin films having excellent characteristics, and consequently to construct various devices and electronic magnetic apparatuses with high reliability. It is also possible to provide an information recording and reproducing apparatus with a low error rate and an information processing device with a high processing rate.

Figure 1:
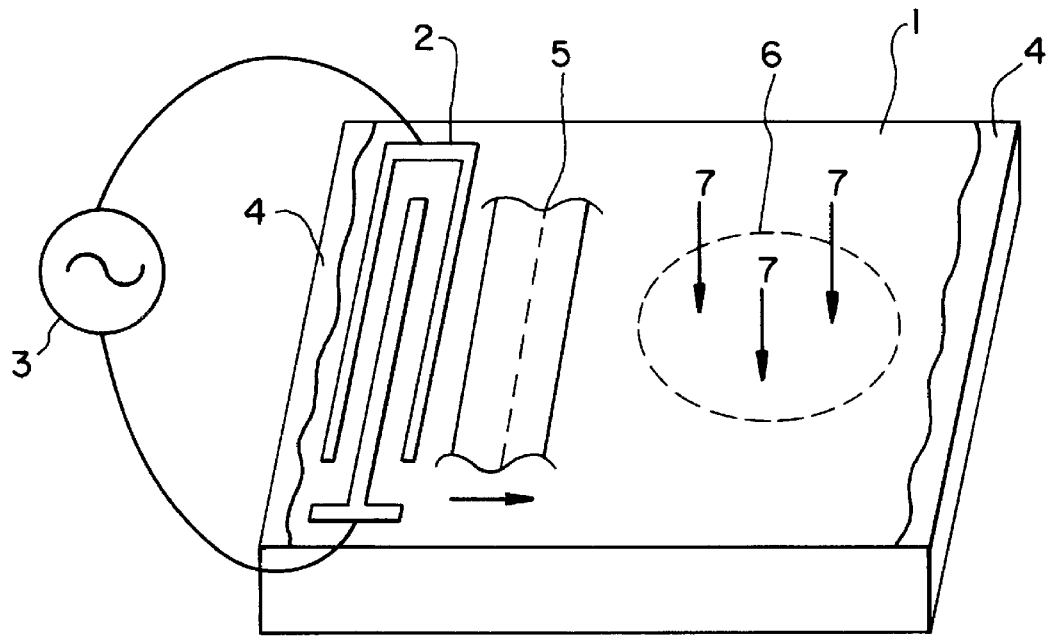
FIG. 1 is a prospective view illustrating the first embodiment of the invention.

A list of parts and numerals shown in the figures is as follows:

| | |
|---|---|
| 1, 20, 23; | Substrate, |
| 2, 19, 43; | Interdigital electrode, |
| 5; | Surface acoustic Wave (SAW), |
| 6, 35; | Thin film formed area, |
| 7; | Flow of particles, |
| 17; | Ultrasonic oscillator, |
| 24; | Wedge-shaped oscillator, |
| 25; | Reflector, |
| 26, 27; | Group of interdigital electrodes, |
| 33; | Lower Core, |
| 34; | Upper core, |
| 36, 44; | Magnetic disk, |
| 37, 38; | Interconnector, |
| 39; | Interlayer insulator, |
| 41; | Atom, |
| 42; | Superconductor thin film, |
| 51; | Source electrode or drain electrode, |
| 52; | Gate electrode. |

DESCRIPTION OF THE PREFERRED EMBODIMENTS

Embodiment 1

The first embodiment of the present invention will be described below, referring to FIGS. 1–10.

In this embodiment, a 128° Y-X cut $LiNbO_3$ crystal 1 was used as a substrate and interdigital electrodes 2 were formed on the substrate.

Surface acoustic wave was generated by applying a high frequency electric field (45 MHz) to both ends of the interdigital electrodes through a signal source 3.

Acoustic absorbers 4 were coated near the edges of the substrate to reduce the reflection of SAW. A mask 9 restricting flow of the particles 7 was mounted on the substrate and then a thin film was prepared on an area 6 by DC sputtering with a Permalloy target having a composition of 83 wt % Ni, 15.7% Fe, 1% Mo and 0.3% others.

Figure 2:
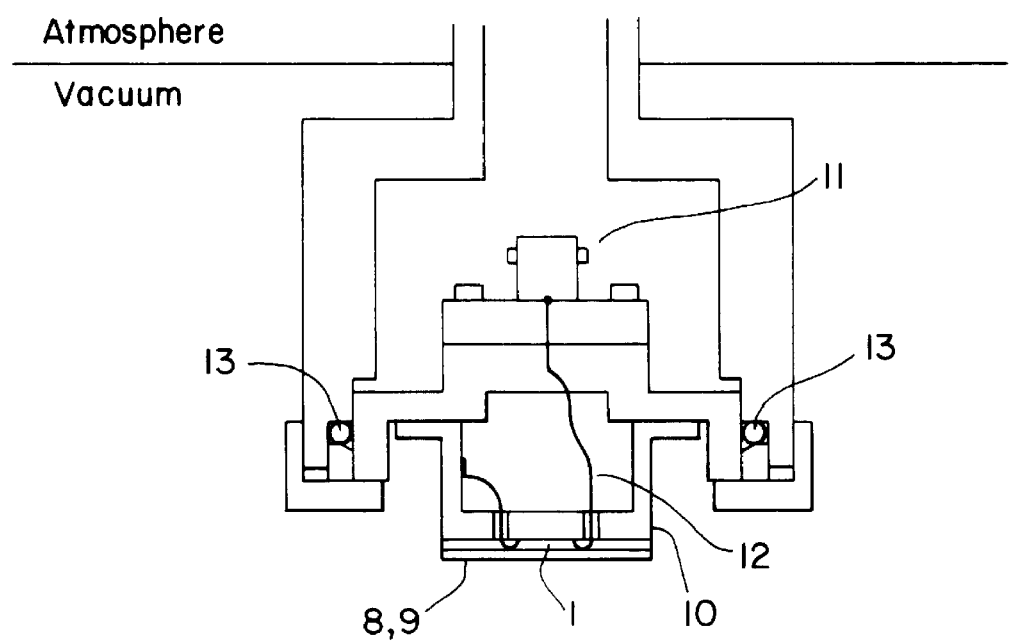
FIG. 2 is a fragmentary sectional view of a film forming apparatus in accordance with the first embodiment.
Figure 3A:
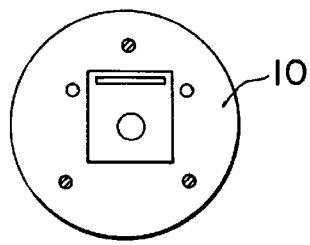
FIG. 3 is a plan view of parts in accordance with the first embodiment.
Figure 3B:
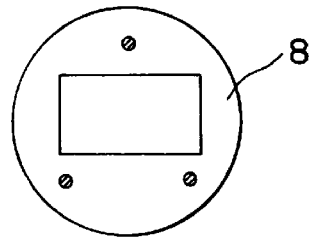
Figure 3C:
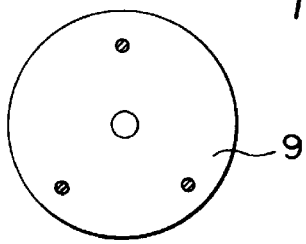

FIG. 2 shows a fragmentary sectional view of a substrate holder of a sputtering apparatus used in this embodiment. The substrate 1 was fixed on a holder body 10 by a substrate retainer 8 and then a mask was mounted on the retainer 8. A high frequency signal was supplied to the interdigital electrodes 2 from electric source terminal 11 through conductive wire 12. The vacuum of a film forming chamber was maintained with an o-ring seal 13. FIG. 3 shows enlarged views of the holder body 10, the retainer 8 and the mask 9.

Figure 4:
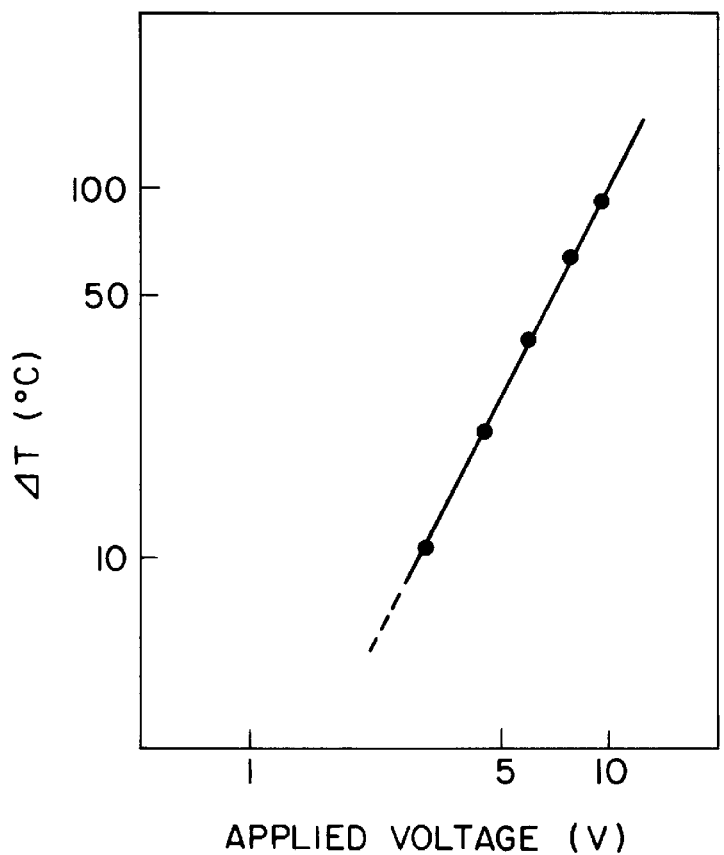
FIG. 4 is a graph showing the relation between applied voltage and the rise in substrate temperature in accordance with the first embodiment.

Most of the energy of SAW generated through electrode 2 is absorbed by acoustic absorbers 4 and converted to heat. Therefore, the temperature of the substrate will rise with the increase in voltage of the signal source 3. FIG. 4 shows the relation between the applied voltage and the rise in substrate temperature. The temperature was obtained from the measurement of deviation of passing frequency characteristics from the pole performed by constructing a few pair of interdigital electrodes on the substrate. The small number of the pair reduces the effect on SAW.

Figure 5:
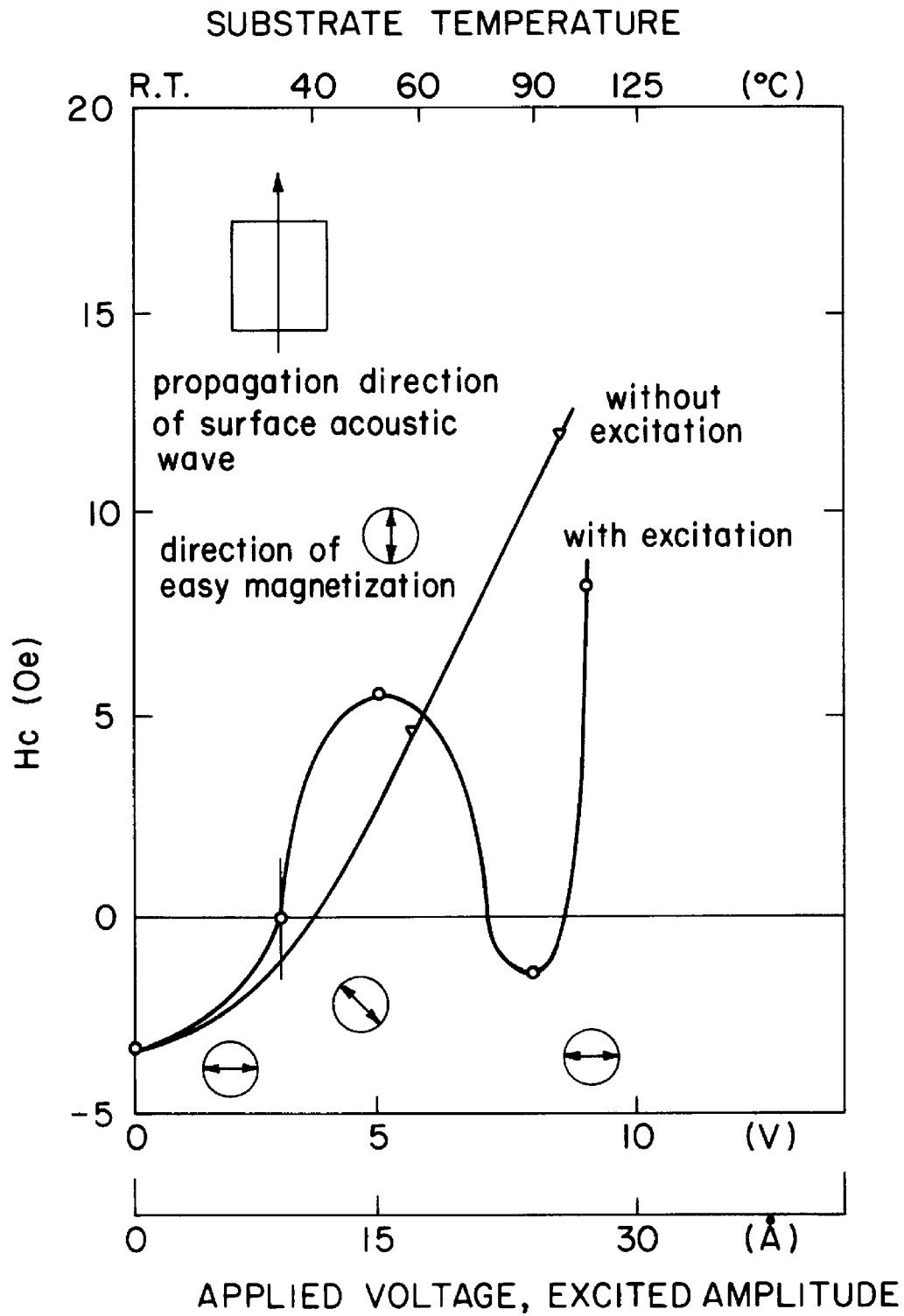
FIG. 5 is a graph showing the anisotropic magnetic field Hk as a function of applied voltage, excited amplitude, or substrate temperature in accordance with the first embodiment.

The thin film was prepared at pressure of 6 mtorr and at deposition rate of 30 nm/min. FIG. 5 represents anisotropic magnetic field Hk as a function of applied voltage through a signal source, temperature of the substrate, or amplitude of SAW. The temperature was obtained from the relationship shown in FIG. 4, and the amplitude from conductance of the device and aperture. In the case of no SAW excitation, the substrate was heated by a heater to the same temperature as that in the case of excitation. In FIG. 5, there is a remarkable difference of anisotropic magnetic field Hk between without excitation and with excitation at an applied voltage of about 8V, which corresponds to 15–30 Å in amplitude of excitation. Namely, it is apparent from the figure that the direction of easy magnetization is changed by excitation. The term "direction of easy magnetization" means a direction or axis in which the magnetic energy becomes a minimum.

Figure 6:
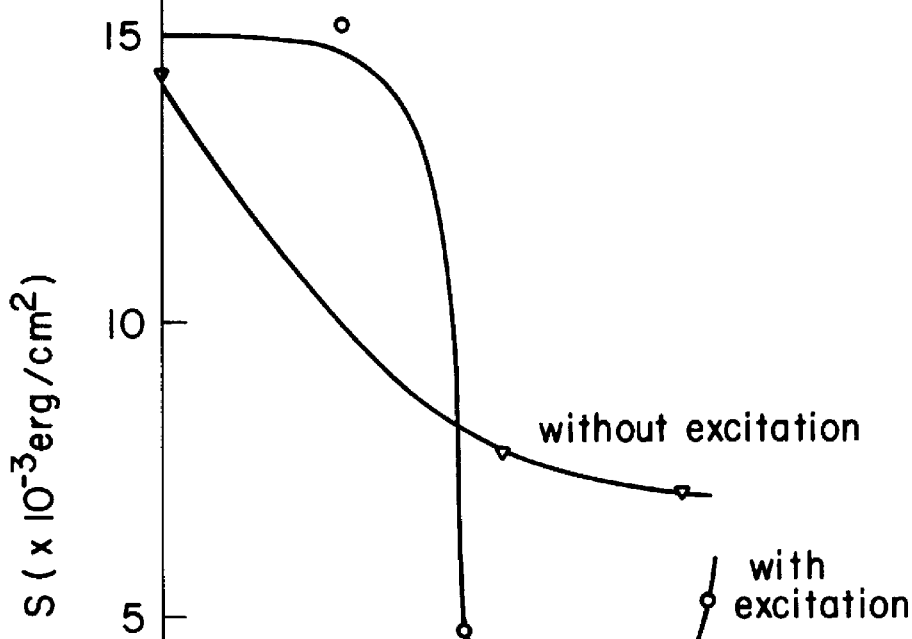
FIG. 6 is a graph showing the structure factor as a function of applied voltage, excited amplitude, or substrate temperature in accordance with the first embodiment.

Similarly, FIG. 6 shows the structure factor S as a function of applied voltage, temperature of the substrate or amplitude of SAW. The structure factor S was obtained by the measurement of dynamic differential susceptibility. The measurement method is described in detail in "The Transaction of the Institute of Electronics, Information and Communication Engineers; Transaction on Magnetic Recording MR89-(1989)."

Figure 7:
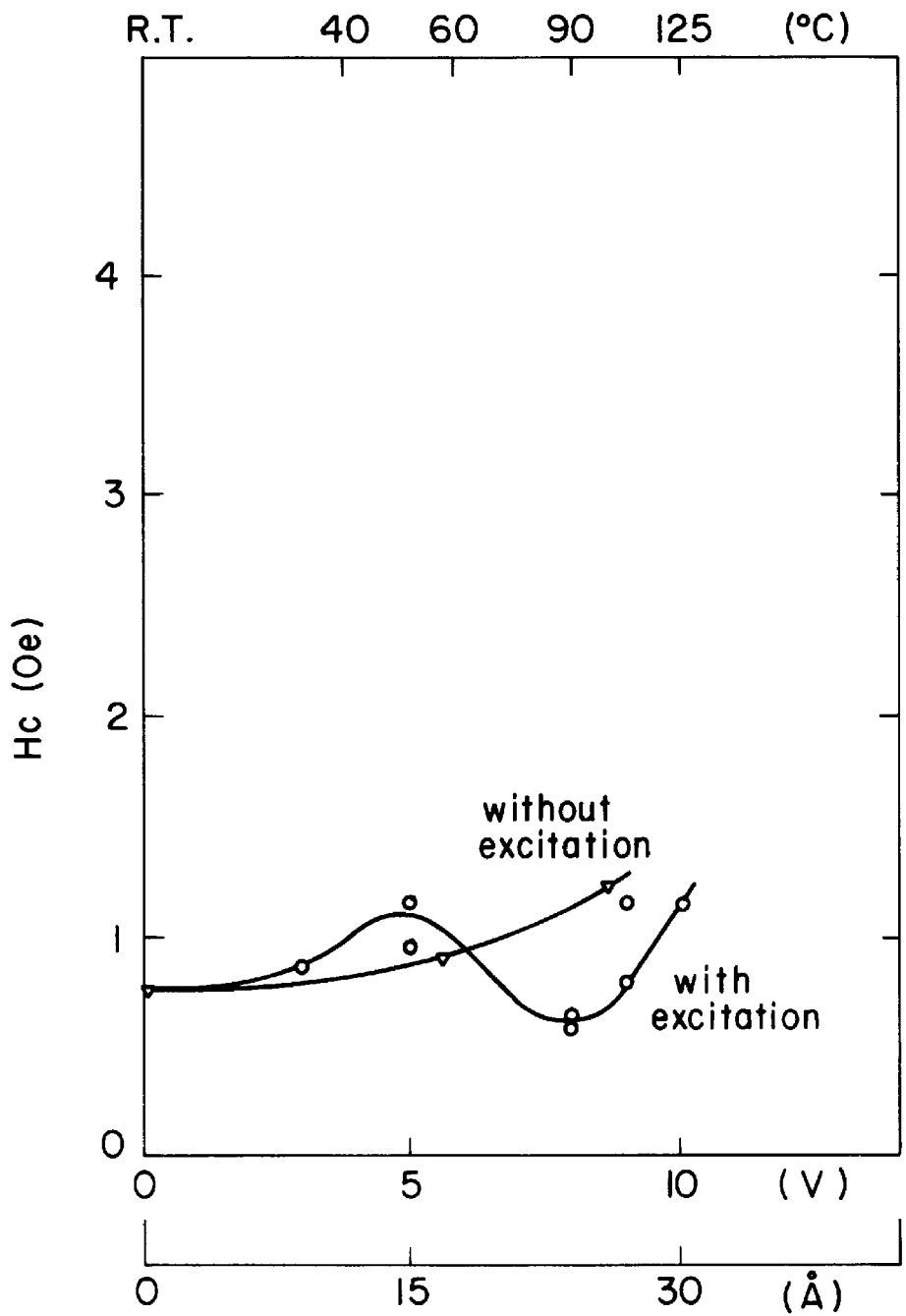
FIG. 7 is a graph showing the coercive force as a function of applied voltage, excited amplitude, or substrate temperature in accordance with the first embodiment.

FIG. 7 shows the saturation magnetization Hc as a function of applied voltage, temperature of the substrate, or excitation amplitude. In FIGS. 6 and 7, drastic differences are observed around 8V between curves. It can be presumed from these results that the crystal grain prepared at an applied voltage of 8V is small.

Figure 8:
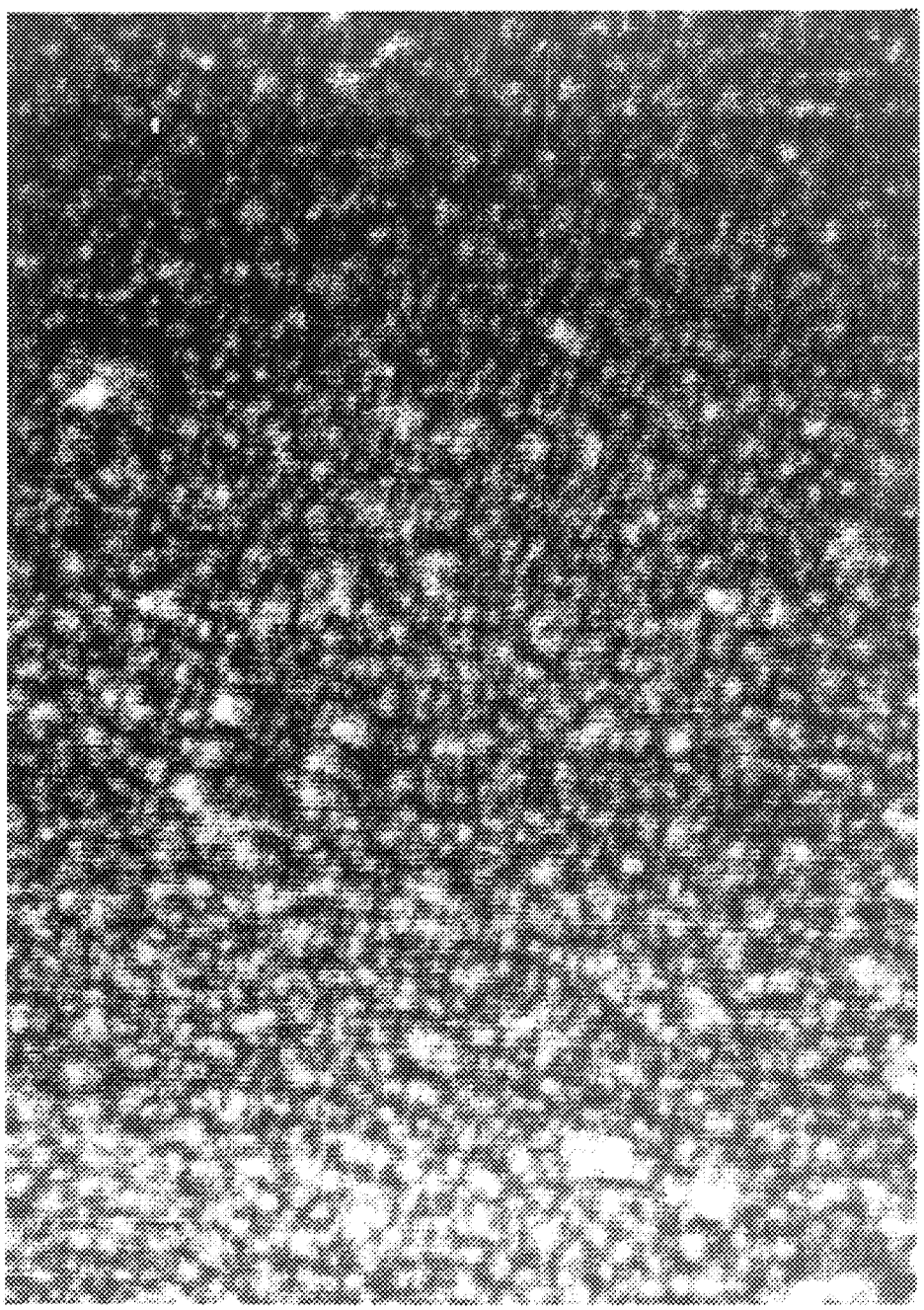
FIG. 8 is a scanning electron microscope (SEM) image of the film prepared at room temperature (without excitation) in accordance with the first embodiment.
Figure 9:
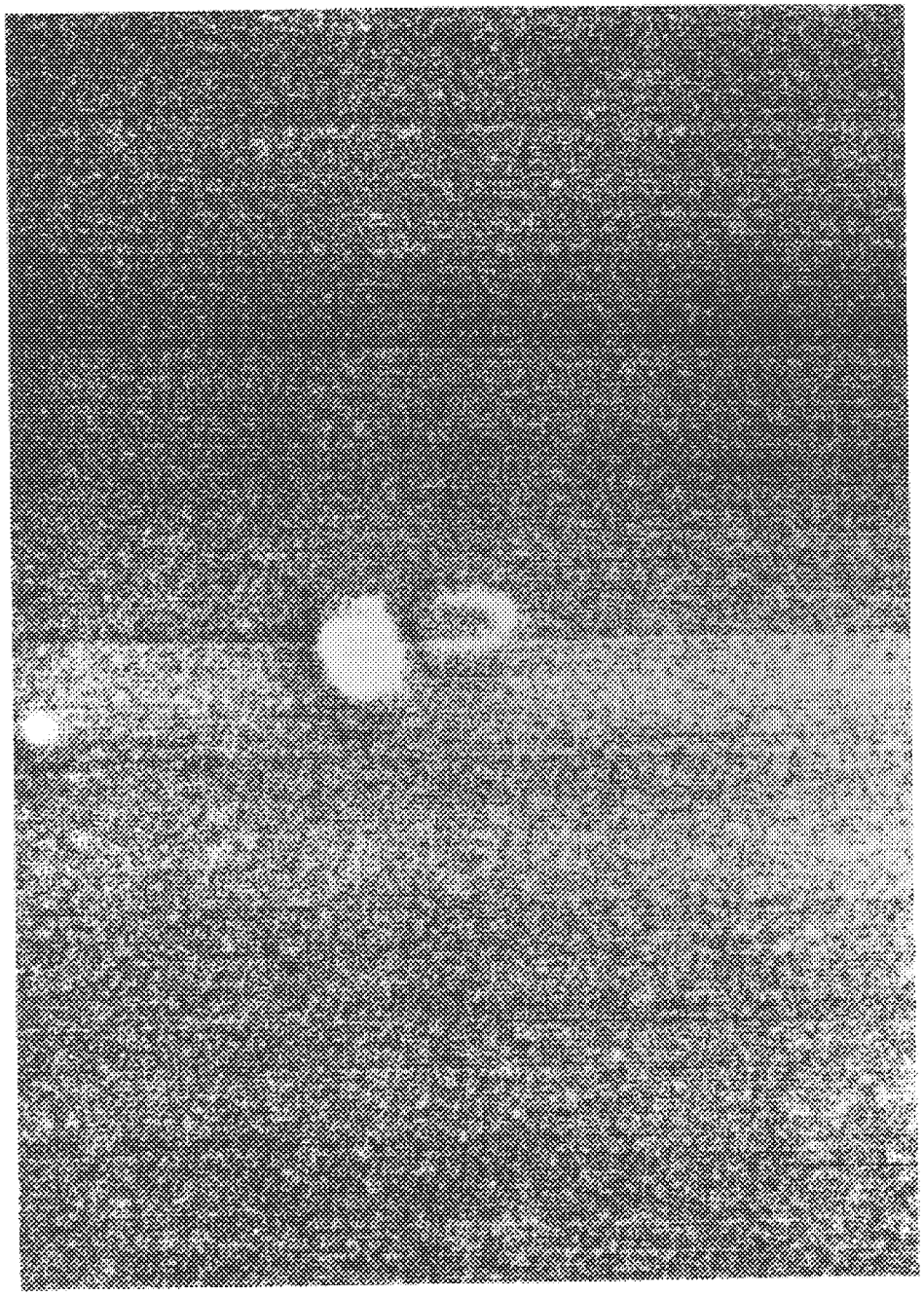
FIG. 9 is a SEM image of the film prepared at applied voltage of 8V in accordance with the first embodiment.
Figure 10:
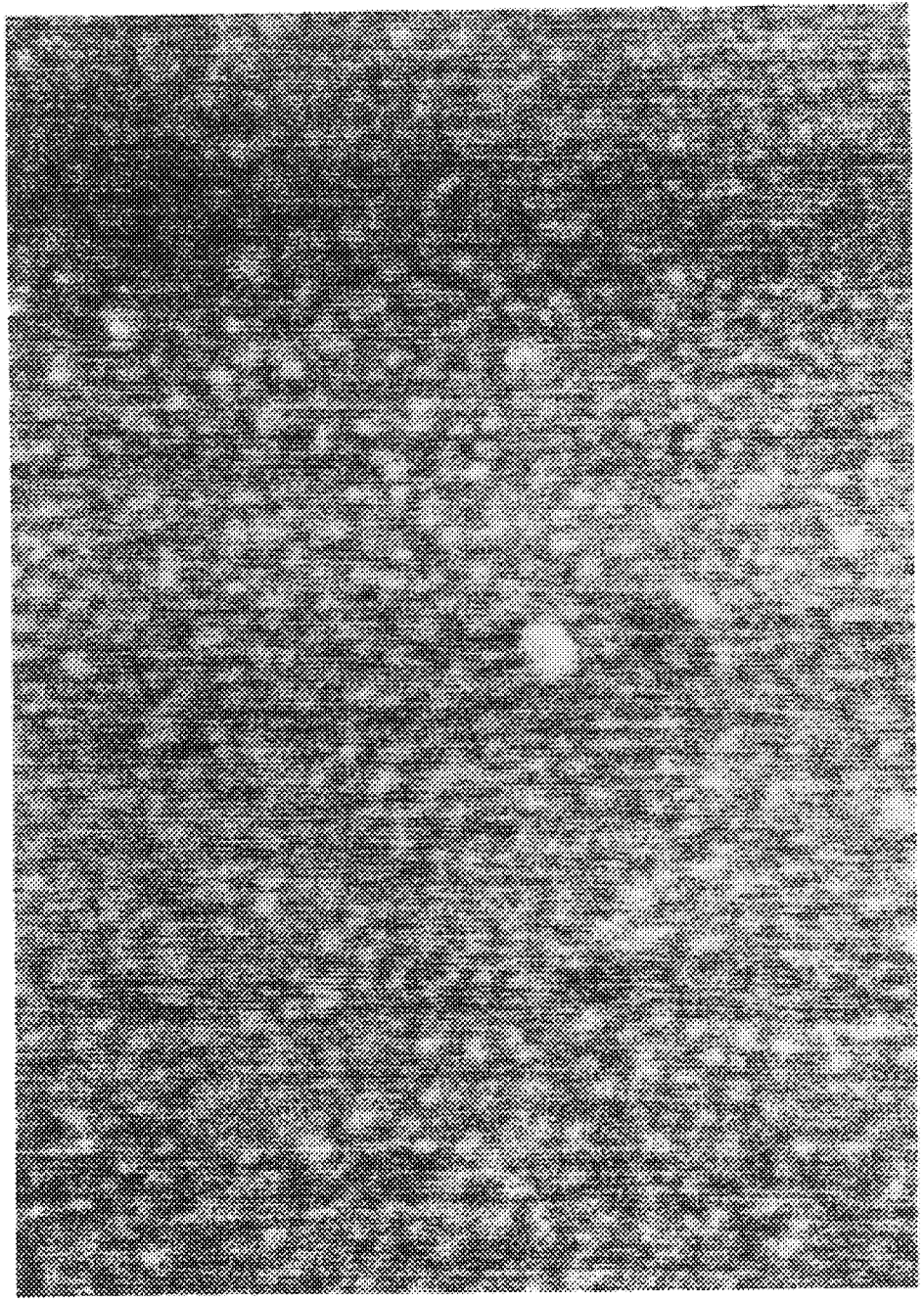
FIG. 10 is a SEM image of the film prepared at applied voltage of 9V in accordance with the first embodiment.

Next, SEM images were observed. FIG. 8 shows a SEM image of a film prepared without excitation at room temperature. This film is made of relatively large crystal grain with a clear grain boundary. FIG. 9 is a SEM image of a film prepared at an applied voltage of 8V, showing that the film is made of small grains with an obscure boundary and a smooth surface. FIG. 10 is a SEM image of a film prepared at an applied voltage of 9V. The film has relatively large crystal grains with a clear boundary.

Thus, it was found in this embodiment that exciting the crystal growth surface makes the crystal grain small and the crystal surface smooth.

Embodiment 2

Figure 11:
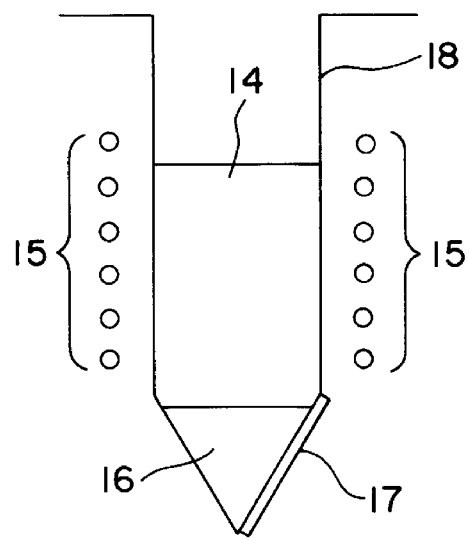
FIG. 11 is a sectional view of the crystal forming furnace in accordance with the second and third embodiments.

FIG. 11 is a sectional view of a Czochralski type single crystal forming furnace in accordance with the second embodiment. A material is placed in a crucible 18 and heated by a heater 15. The melt of the material is in contact with a single crystal 16. An ultrasonic oscillator 17 is fixed to the bottom of the crucible 18. The mechanical oscillation generated by an ultrasonic oscillator 17 reaches the crystal growth surface and causes the smoothness of crystal growth plane. As a result, a high quality single crystal can be formed. The reason is not yet clear why the quality of the crystal is improved by oscillation, but it may be attributed to the increase in collision probability between atoms or molecules.

According to the second embodiment, it becomes possible to form a single crystal with high quality and high uniformity. In other words, contrary to a prior art single crystal pulling method wherein it has been thought to be important to keep the solid-liquidinterface (i.e., interface between a seed crystal and melt) as stationary as possible in order to prepare a high quality single crystal, in this invention, a homogeneous high quality single crystal could be prepared by oscillating the interface.

Embodiment 3

The same apparatus as shown in the second embodiment was used. In this embodiment, a material contains a second element (and others) more than its solid solubility limit. Though, in general, it is thought to be difficult to mix the element more than its solubility limit, it becomes possible by using the apparatus of this embodiment to produce a composite containing the second element homogeneously. A similar effect can be expected in the case other than a single crystal, i.e., in the case that no seed crystal is used. For example, it is possible to homogeneously introduce the second element and the third element into the thin film deposited from vapor phase without segregation.

Embodiment 4

Figure 12:
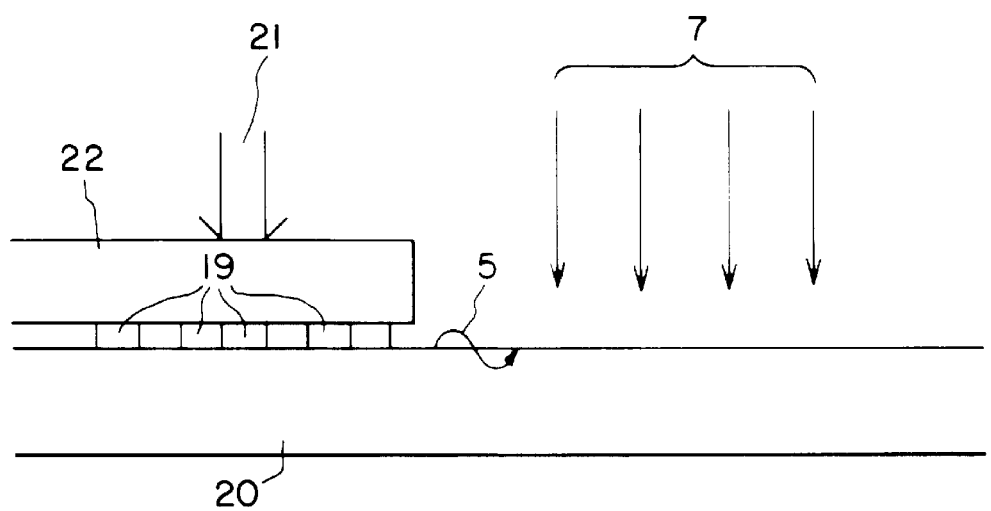
FIG. 12 is a schematic diagram showing a method of SAW excitation in accordance with the fourth embodiment.

The fourth embodiment is explained by referring to FIG. 12. This embodiment relates to a method for exciting a surface acoustic wave. As mentioned in the first embodiment, interdigital electrodes are constructed on the substrate to generate SAW. Therefore, interdigital electrodes must be constructed on every substrate and connected to external electrodes, resulting in low productivity. In this embodiment, a piezoelectric substrate 22 with interdigital electrodes 19 was pressed by external force 21 onto a substrate 20 and then SAW 5 was excited. A thin film is prepared by the flow of particles onto the substrate 20 which is being excited by SAW.

Thus, this embodiment can be preferably used in mass production because it is unnecessary to construct interdigital electrodes on every substrate.

Embodiment 5

Figure 13:
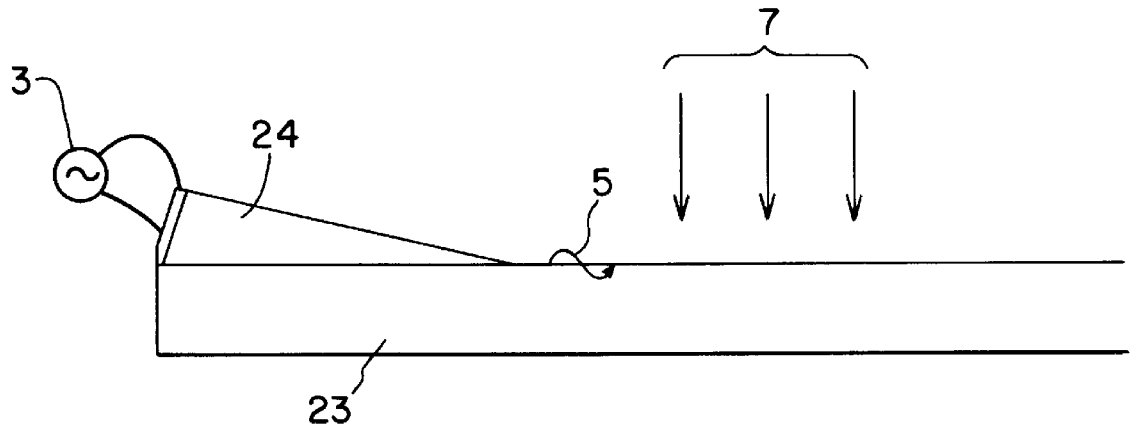
FIG. 13 is a schematic diagram showing a method of SAW excitation in accordance with the fifth embodiment.

In the first embodiment, the substrate is required to be piezoelectric. In the fourth embodiment, efficiency of excitation is low though SAW can be generated on a non-piezoelectric substrate. The fifth embodiment shown in FIG. 13 provides a method for solving these problems. An oscillator is attached to the surface of a non-piezoelectric substrate 23. The mechanical oscillation excited by signal source 3 propagates as SAW. A thin film is formed on the substrate under oscillation by the flow of particles 7 as mentioned above.

By using this embodiment various types of substrates can be used because no piezoelectric substrates are required.

Embodiment 6

Figure 14:
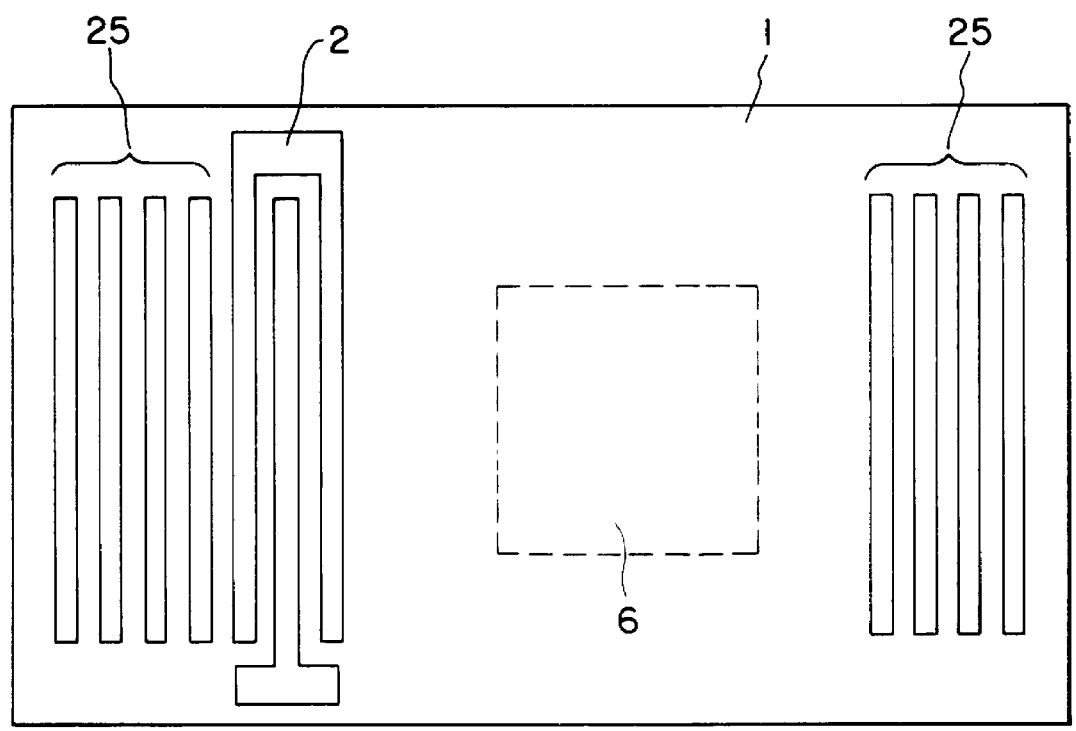
FIG. 14 is a schematic diagram showing a method of SAW excitation in accordance with the sixth embodiment.

FIG. 14 shows the sixth embodiment. Reflectors 25 are prepared on both sides of interdigital electrodes 2 such that a stationary wave is generated. Therefore, a node and loop appear in SAW and one-dimensional alternating pattern of large and small crystal grains is formed in an area 6. And since the energy of SAW is confined between the reflectors 25, a larger amplitude of excitation can be generated with less voltage. Furthermore, acoustic absorbers become unnecessary by making the reflection coefficient of reflector 25 large. This means that the rise in the substrate temperature is suppressed because of a decrease in the energy to be converted to heat. The high reflection coefficient is attained by increasing the number of lines of the reflector.

According to this embodiment, the formation of a one-dimensional pattern of thin film becomes possible with preventing the substrate temperature from rising. This means that the degree of freedom in preparing thin films increases.

Embodiment 7

Figure 15:
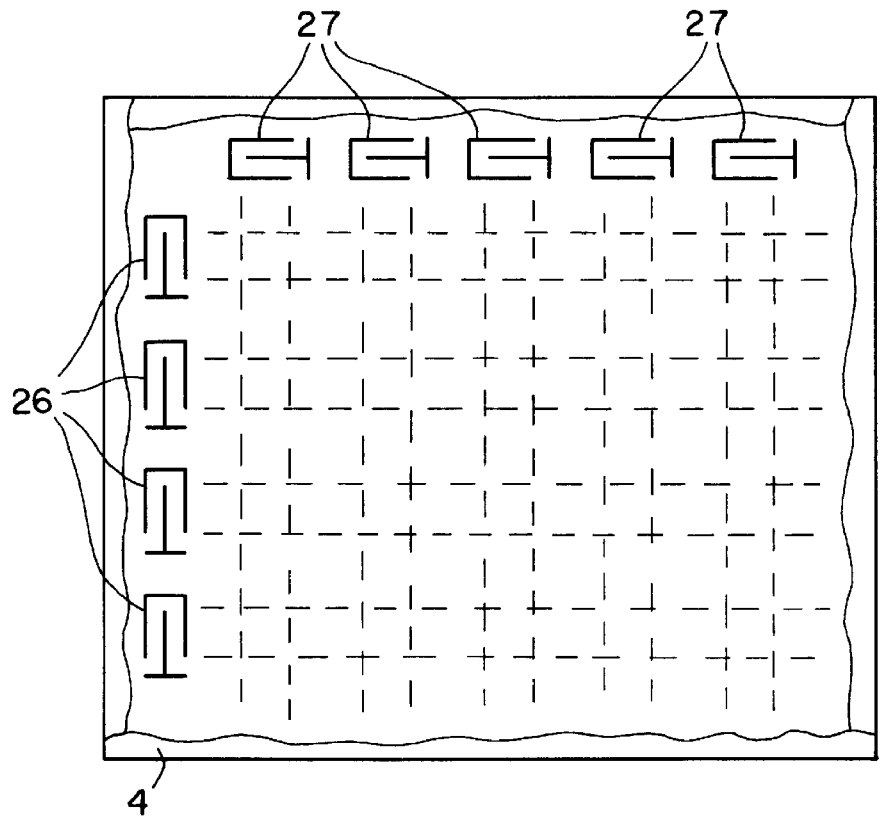
FIG. 15 is a plan view in accordance with the seventh embodiment.

The seventh embodiment is explained by referring to FIG. 15. The formation of a one-dimensional pattern was carried out in the sixth embodiment. The seventh embodiment makes the formation of a two dimensional pattern possible. Two groups of a plurality of interdigital electrodes 26 and 27 are constructed in the directions of Y axis and X axis in order to two-dimensionally control the quality of a thin film. In other words, the amplitudes of SAW generated by interdigital electrodes 26 and 27 are adjusted 10–30 Å, each amplitude being adjusted to the value not more than 15 Å. Furthermore, by scanning each excitation, it is possible to control crystal morphology in any case. In the case that only one group of electrodes is constructed, the one dimensional control of crystal morphology can be attained as mentioned in the sixth embodiment.

An mentioned above, two-dimensional control of crystal morphology becomes possible. Thus, this method is preferably used for formation of two-dimensional devices such as an integrated circuit.

Embodiment 8

Figure 16:
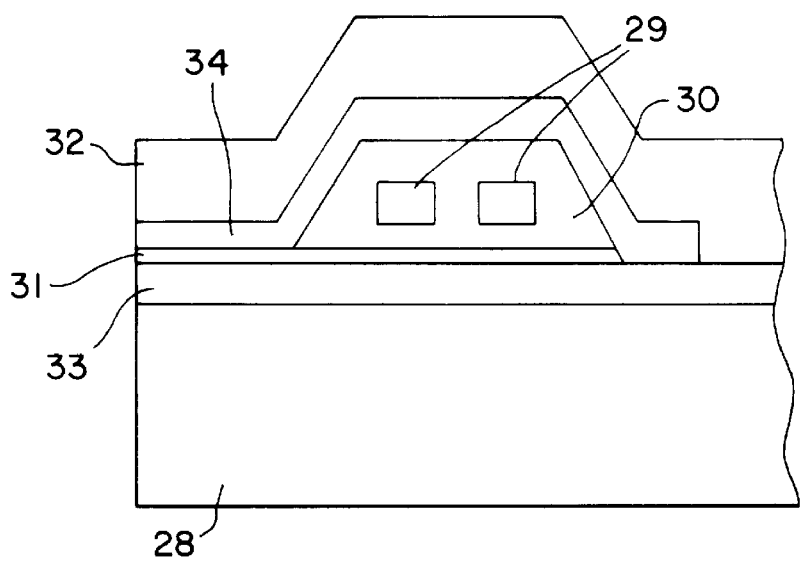
FIG. 16 is a sectional view of a thin film magnetic head in accordance with the eighth embodiment.

The eighth embodiment is explained by referring to FIG. 16. FIG. 16 shows a sectional view of a thin film head prepared by this embodiment.

At first, a lower core 33 is prepared as a substrate is being excited by SAW. The grain size of the film thus prepared was so fine that the permeability of the film was so high. Then, after a gap member 31, a coil 29 and an insulator 30 are formed, an upper core 31 is prepared under the excitation by SAW as well as the lower core 33 to make the permeability of the core higher. Finally, a passivation film 32 is prepared and then diced to the head by a dicing apparatus.

This embodiment makes it possible to produce a high permeability thin film head with high efficiency of recording and reproducing characteristics.

Embodiment 9

Figure 17:
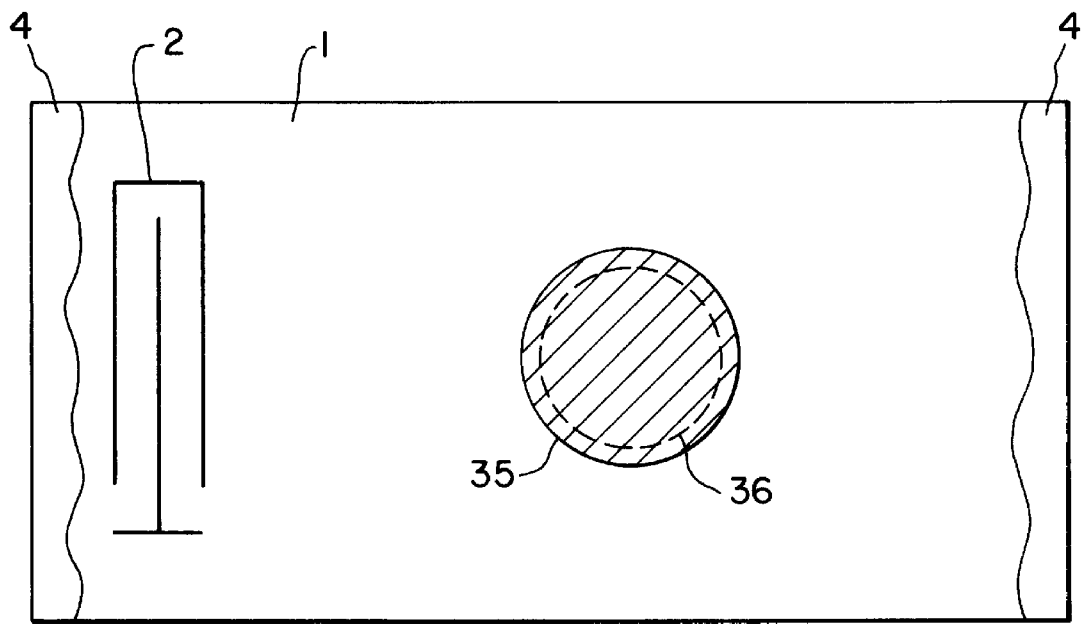
FIG. 17 is a schematic diagram showing a method for constructing a magnetic disk in accordance with the ninth embodiment.

The ninth embodiment is explained by referring to FIG. 17 illustrating a method of preparing a hard magnetic disk as a magnetic memory medium device. Interdigital electrodes 2 and acoustic absorbers 4 are prepared on a piezoelectric substrate 1. A thin film of hard material is prepared on the area 35 as the substrate is being excited by SAW. By this method, the preparation of a hard material with a fine crystal grain becomes possible and therefore a thin film with short coherent length can be prepared. Next, the magnetic disk is constructed by e.g., an ultrasonic fabrication.

Thus, it becomes possible by this embodiment to construct a magnetic disk with a short coherent length, i.e., high recording density.

Embodiment 10

Figure 18:
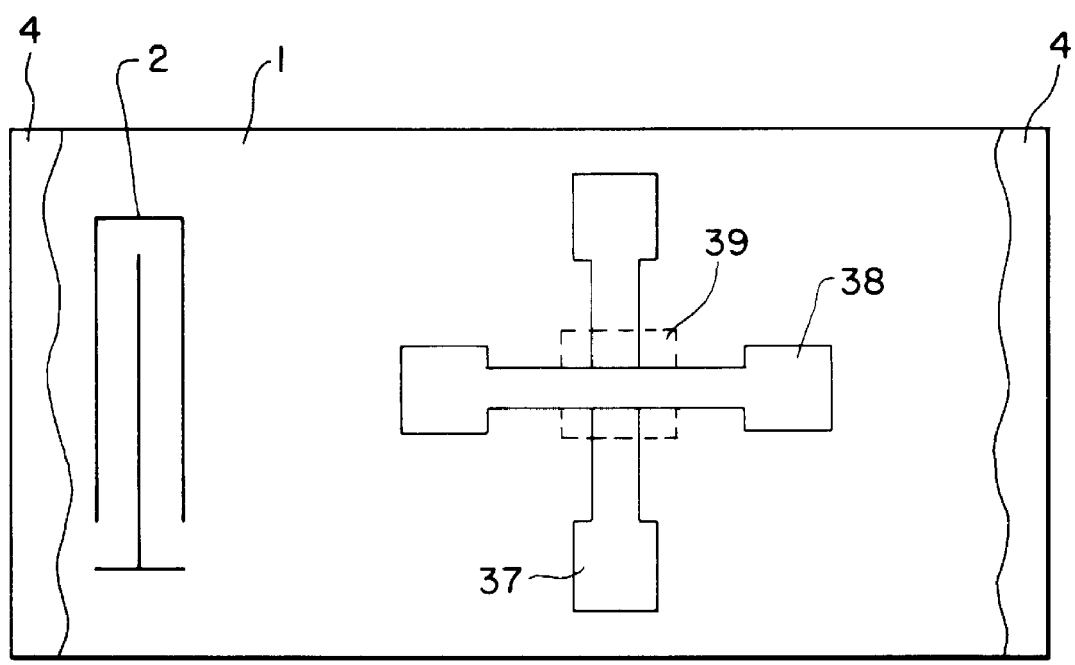
FIG. 18 is a schematic diagram showing a part of the interconnecting pattern in accordance with the tenth embodiment.

The tenth embodiment is explained by referring to FIG. 18 which illustrates a method of preparing an interconnector pattern of an integrated circuit. In this figure, only the primary portion is shown. As in the first embodiment, interdigital electrodes 2 and acoustic absorbers 4 are formed on a piezoelectric substrate 1, and then lower interconnector 37, interlayer insulator 39 and upper interconnector 38 are prepared on the substrate excited by SAW. By the excitation of SAW, the crystal grain of the film is so fine that the interconnector has a high resistance to migration and a high bonding strength, and the insulator has a high dielectric breakdown strength.

Thus, it becomes possible by this embodiment to prepare reliable interconnectors for in use in an integrated circuit.

Embodiment 11

Figure 19:
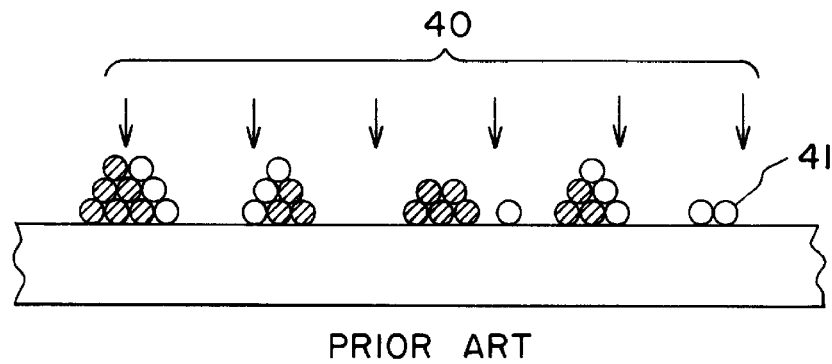
FIG. 19 is a schematic diagram showing a prior art MBE method.
Figure 20:
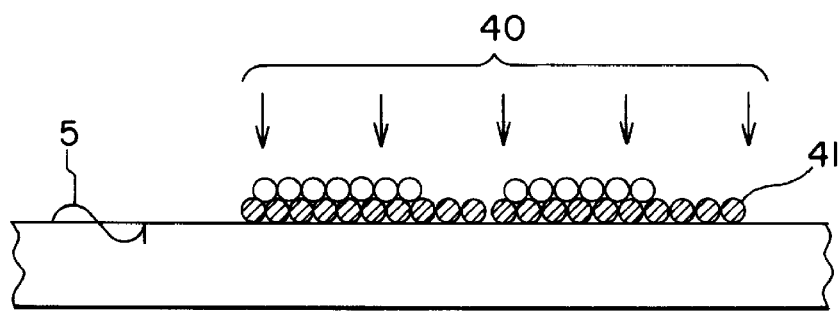
FIG. 20 is a schematic diagram showing a method of forming a superlattice thin film in accordance with the eleventh embodiment.

The eleventh embodiment of the invention is explained by referring to FIGS. 19 and 20.

FIG. 19 shows a thin film forming process by a prior art MBE method. In the prior art method, it is difficult to form a superlattice, especially of metal. A flow of the evaporated atoms 40 reach a substrate and, as shown in the figure, every atomic layer is composed of both atoms 41 (a black and a white circle mean an A atom and a B atom, respectively); for example, the atom A enters into both the second and third atomic layer. FIG. 20 shows a method of preparing a superlattice of the present invention. A thin film is prepared as the substrate is being excited by SAW as mentioned above, resulting in the formation of a superlattice with high quality as a result of increase in the smoothness of the surface of every layer.

Thus, it is possible by this embodiment to prepare a superlattice which has been commonly difficult to prepare by the prior art.

Embodiment 12

Figure 21:
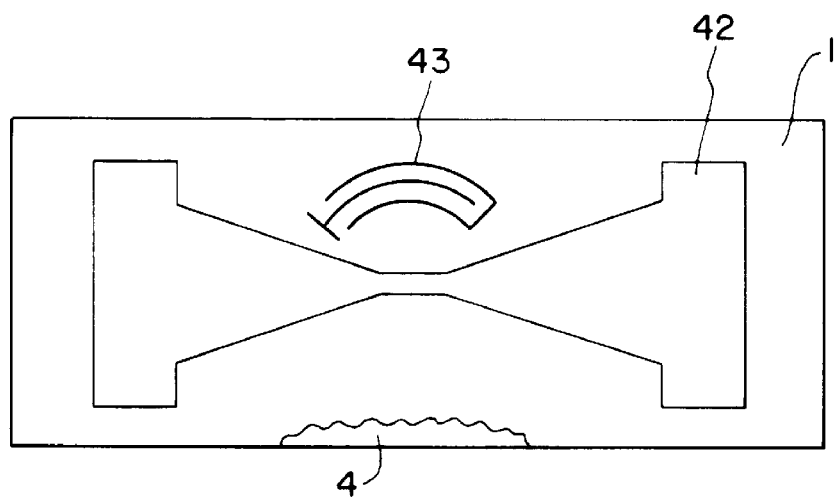
FIG. 21 is a schematic diagram showing a method for forming a Josephson device in accordance with the twelfth embodiment.

The twelfth embodiment of the invention is explained by referring to FIG. 21.

FIG. 21 shows a superconductor thin film prepared by the present invention. As in the first embodiment, interdigital electrodes 43 and acoustic absorbers 4 are formed on a piezoelectric substrate 1, and then a superconductor thin film 42 Is prepared on the substrate excited by SAW. Interdigital electrodes 43 are prepared in an arc shape so that SAW can be focused on a point where the thin film with fine crystal grain and short coherent length can be prepared. Therefore, since superconductivity is weakened, a Josephson bonding can be easily constructed there.

Thus, it is possible by this embodiment to reproduce a Josephson bonding relatively easily and reliably.

Embodiment 13

Figure 22:
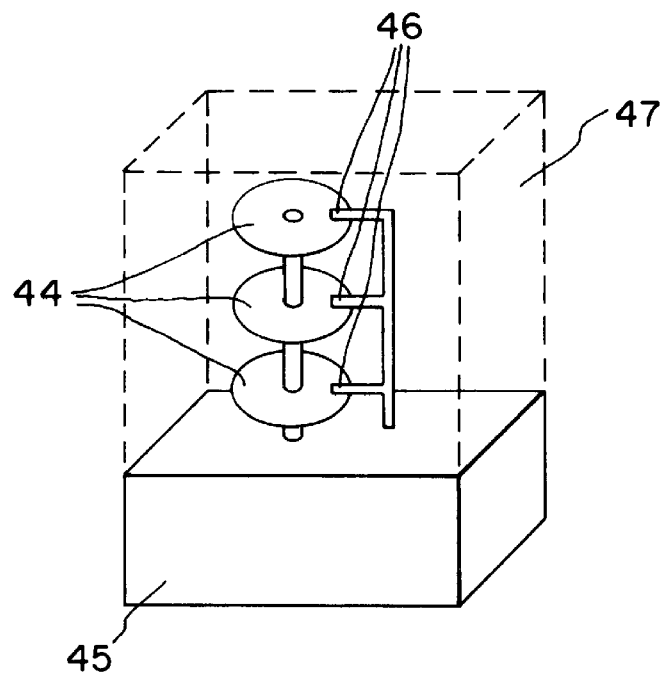
FIG. 22 is a schematic diagram showing a magnetic recording and reproducing apparatus in accordance with the thirteenth embodiment.

The thirteenth embodiment of the invention is explained by referring to FIG. 22 which illustrates a magnetic recording and reproducing apparatus having a hard magnetic disk of the present invention. In this embodiment, an external memory unit 47 used for controlling instruments is constructed in which a controller 45 controls the movement of the magnetic disk 44 prepared by the ninth embodiment and the thin film head 46 prepared by the eighth embodiment.

Thus, it becomes possible to construct the external memory unit with a low error rate and a large recording capacity.

Embodiment 14

Figure 23:
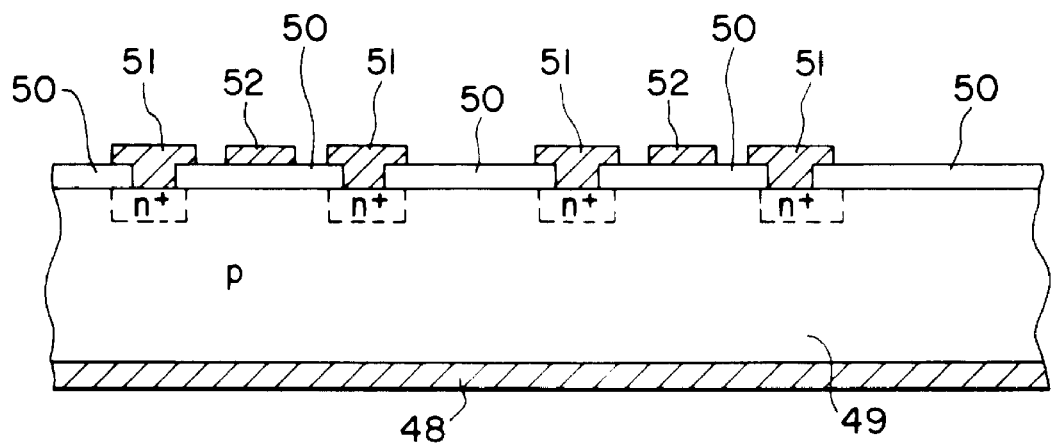
FIG. 23 is a fragmentary sectional view of an integrated circuit in accordance with the fourteenth embodiment.

The fourteenth embodiment of the invention is explained by referring to FIG. 23 which illustrates a fragmentary sectional view of part of an integrated circuit prepared by the invention. The figure shows a MOSFET. A $SiO_2$ film 50 and a conductive film 48 are formed on the front surface and on the back surface of a p-type silicon substrate 49, respectively. Then, in the same manner as in the tenth embodiment, source and drain electrodes 51, gate electrode 52, and an interconnector and interlayer insulator are formed as the substrate is being excited by SAW, producing devices having high resistance to migration.

Thus, it becomes possible by this embodiment to construct the integrated circuit with high reliability and long lifetime.

Embodiment 15

Figure 24:
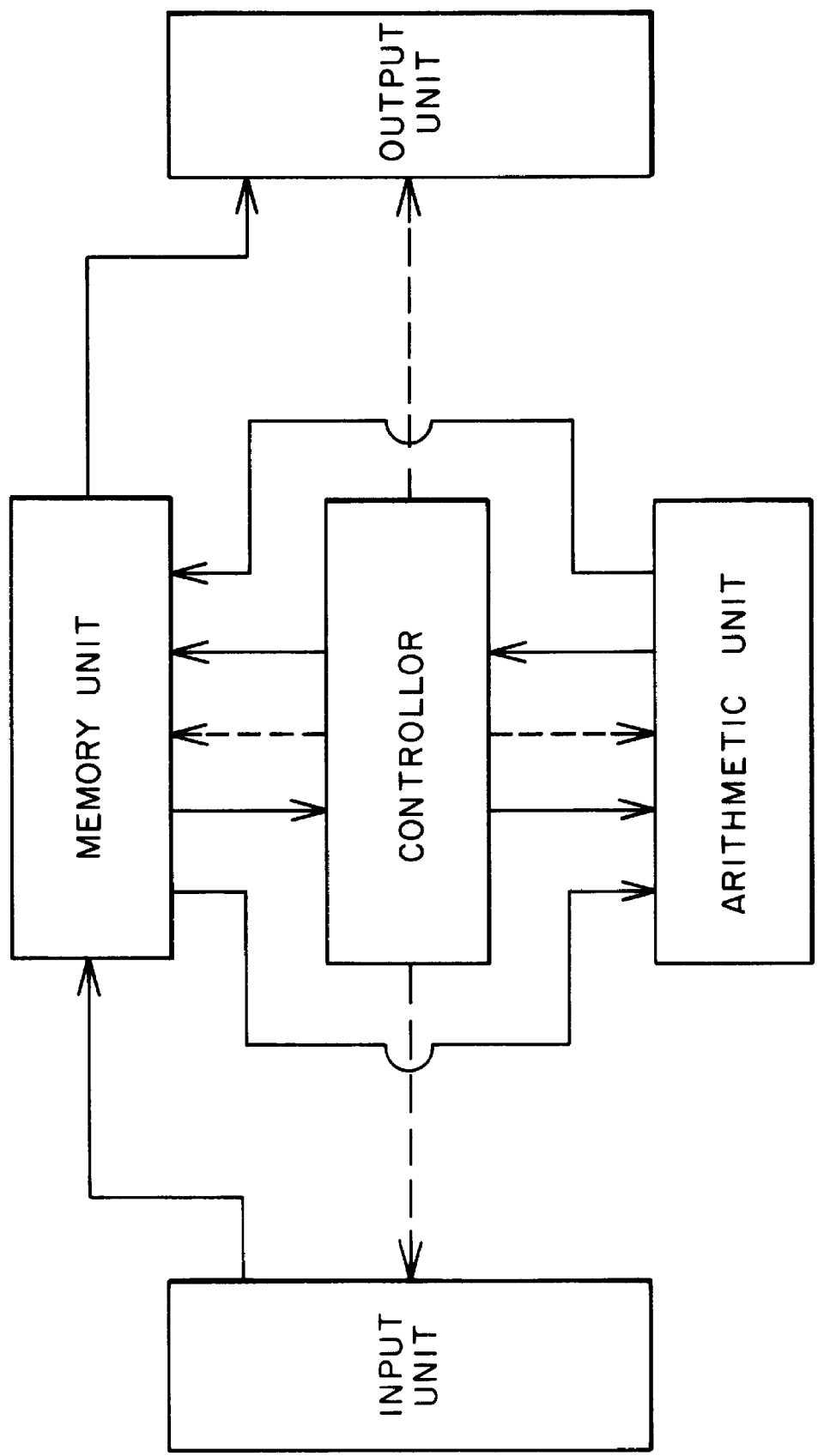
FIG. 24 is a block diagram showing an electronic computer system in accordance with the fifteenth embodiment.

The fifteenth embodiment of the invention is explained by referring to FIG. 24 which illustrates a block diagram of a computer system of the present invention.

Information data inputted through a keyboard and other input units are sent to and stored in a memory unit under the control of a controller. The information data stored in the memory unit is processed by an arithmetic unit, and the results are stored in the memory unit under the control of the controller. Then, the results are outputted through an output unit. In FIG. 24, solid lines represent the flow of information data, and the broken line represents the control. Here, the magnetic disk apparatus of the thirteenth embodiment and the integrated circuit of the fourteenth embodiment are used as a memory unit and an arithmetic unit, respectively. By using these apparatuses, high reliability and large memory capacity can be attained.

Thus, it is possible to provide an information processing apparatus with high reliability and large memory capacity. As mentioned above, the present invention makes it possible to control the crystal growth of thin films and bulk materials and therefore to manufacture various types of materials with high quality. Consequently, a high reliability, high efficiency and large capacity of the apparatus can be attained.

We claim:

1. A method for preparing a crystal thin film on a surface of substrate of one of a semiconductor device, magnetic device, and superconductor device, wherein said crystal thin film is prepared by one of sputtering, evaporation, and chemical vapor deposition and is deposited as said substrate or said surface of said substrate is being excited by a surface acoustic wave, wherein the amplitude of the surface acoustic wave excitation is in the range of 1.5 to 3.0 nm.

2. The method according to claim 1, wherein said substrate is piezoelectric.

3. The method according to claim 1, wherein said surface acoustic wave is a stationary wave.

4. An apparatus for preparing a crystal thin film on a surface of a substrate of one of a semiconductor device, magnetic device, and a superconductor device, comprising a means for exciting the surface of the substrate by a surface acoustic wave, said exciting means comprising only one interdigital electrode disposed on a first end of the surface on which said crystal thin film is deposited, and an acoustic absorber for reducing the reflection of the surface acoustic wave, said acoustic absorber disposed on a second end of the surface opposite said exciting means, whereby the crystal thin film is deposited in the area between said exciting means and said acoustic absorber.

5. The apparatus according to claim 4, wherein said exciting means comprises an interdigital electrode and means for applying a voltage to said interdigital electrode.

6. The apparatus according to claim 5, wherein said interdigital electrode is fixed on said substrate.

7. The apparatus according to claim 5, wherein said interdigital electrode is formed on a piezoelectric member and said piezoelectric member is in contact with said substrate.

8. The apparatus according to claim 5, wherein said interdigital electrode is formed in an arc shape.

9. The apparatus according to claim 4, wherein said exciting means is a wedge-shaped oscillator.

10. The apparatus according to claim 9, wherein said substrate is non-piezoelectric.

11. The apparatus according to claim 4, wherein a plurality of said exciting means are provided.

12. The apparatus according to claim 11, wherein a plurality of said exciting means are disposed such that the substrate is excited two-dimensionally.

* * * * *

UNITED STATES PATENT AND TRADEMARK OFFICE
CERTIFICATE OF CORRECTION

PATENT NO. : 5,837,332
DATED : November 17, 1998
INVENTOR(S) : Migaku Takahashi et al It is certified that error appears in the above-identified patent and that said Letters Patent is hereby corrected as shown below:

Claim 1, Col. 8, Line 40 insert --a-- before "substrate".

Signed and Sealed this

Eleventh Day of May, 1999

*Attest:*

Q. TODD DICKINSON

*Attesting Officer*  *Acting Commissioner of Patents and Trademarks*